(12) United States Patent
Lim et al.

(10) Patent No.: US 10,571,764 B2
(45) Date of Patent: Feb. 25, 2020

(54) DISPLAY DEVICE

(71) Applicant: LG DISPLAY CO., LTD., Seoul (KR)

(72) Inventors: Changtaek Lim, Paju-si (KR); Jehong Park, Seoul (KR); Chiwoong Kim, Goyang-si (KR); Yunsung Jang, Seoul (KR); Sanguk Kim, Seoul (KR); Dae-Kwon Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/116,372

(22) Filed: Aug. 29, 2018

(65) Prior Publication Data

US 2019/0064615 A1 Feb. 28, 2019

(30) Foreign Application Priority Data

Aug. 30, 2017 (KR) .......................... 10-2017-0110219

(51) Int. Cl.
*G02F 1/1362* (2006.01)
*G02F 1/1335* (2006.01)
*G02F 1/1333* (2006.01)
*H01L 27/12* (2006.01)
*G02F 1/1345* (2006.01)
(Continued)

(52) U.S. Cl.
CPC ......... *G02F 1/136204* (2013.01); *G02B 1/16* (2015.01); *G02F 1/13338* (2013.01); *G02F 1/13458* (2013.01); *G02F 1/133512* (2013.01); *G02F 1/133528* (2013.01); *G06F 3/0412* (2013.01); *H01L 27/124* (2013.01); *H01L 27/1218* (2013.01); *G02F 2001/133331* (2013.01); *G02F 2202/22* (2013.01); *G06F 2203/04103* (2013.01)

(58) Field of Classification Search
CPC ......... G02F 1/133528; G02F 1/136204; G02F 2001/133331; G02F 1/13458; G02F 1/13338; G02F 2202/22; G06F 3/0412; G06F 2203/04103; G02B 1/16
See application file for complete search history.

(56) References Cited

U.S. PATENT DOCUMENTS 6,177,969 B1 * 1/2001 Kondo .............. G02F 1/136277
257/619
2010/0182524 A1 * 7/2010 Nomura ............ G02F 1/133308
349/40
(Continued)

FOREIGN PATENT DOCUMENTS

CN 105807482 A 7/2016
CN 106842691 A 6/2017
(Continued)

*Primary Examiner* — Jessica M Merlin
(74) *Attorney, Agent, or Firm* — Birch, Stewart, Kolasch & Birch, LLP

(57) ABSTRACT

A display device is provided. The display device includes a first substrate including a thin film transistor array and a ground pad disposed on a first surface of the first substrate, a second substrate that faces the first surface of the first substrate and is bonded to the first substrate, a reinforcing substrate that faces a second surface of the first substrate, an antistatic layer disposed between the first substrate and the reinforcing substrate, and a ground path unit formed in a line shape enclosing a side of the first substrate and configured to interconnect the ground pad and the antistatic layer.

18 Claims, 7 Drawing Sheets

(51) Int. Cl.
*G06F 3/041* (2006.01)
*G02B 1/16* (2015.01)

(56) References Cited

U.S. PATENT DOCUMENTS

| | | | | |
|---|---|---|---|---|
| 2013/0329171 | A1* | 12/2013 | Xu | G02F 1/134363 |
| | | | | 349/106 |
| 2015/0323843 | A1* | 11/2015 | Park | G02F 1/13439 |
| | | | | 362/607 |
| 2016/0187723 | A1* | 6/2016 | Yue | G02B 5/305 |
| | | | | 349/97 |
| 2018/0284537 | A1 | 10/2018 | Jiang et al. | |

FOREIGN PATENT DOCUMENTS

| | | |
|---|---|---|
| KR | 10-2005-0023559 A | 3/2005 |
| KR | 10-2011-0035145 A | 4/2011 |
| KR | 10-2013-0073664 A | 7/2013 |
| KR | 10-2015-0035256 A | 4/2015 |
| KR | 10-2015-0142337 A | 12/2015 |
| KR | 10-2016-0002565 A | 1/2016 |
| KR | 10-2016-0059839 A | 5/2016 |

\* cited by examiner

DISPLAY DEVICE

CROSS-REFERENCE TO RELATED APPLICATION

This application claims priority under 35 U.S.C. § 119 to Korean Application No. 10-2017-0110219, filed in the Republic of Korea on Aug. 30, 2017, the entire disclosure of which is herein incorporated by reference into the present application.

BACKGROUND

1. Field of the Invention

The present disclosure relates to a display device including an antistatic layer to discharge external static electricity.

2. Description of Related Art

A display device is applied to various electronic devices such as a TV, a mobile phone, a notebook computer, a tablet computer, and the like. Therefore, studies for developing a thin and light-weight display device with low power consumption have been ongoing. For example, the display device can include a liquid crystal display device (LCD), a plasma display panel (PDP), a field emission display (FED), an electroluminescence display device (ELD), an electro-wetting display device (EWD), and an organic light emitting display device (OLED).

Generally, the display devices include a pair of substrates that face each other and are bonded to each other. A polarizing material or a light emitting material is disposed between the pair of substrates.

For convenience of a user, the display device has been developed and commercialized to include a function of sensing a touch input. The touch sensing function, which is a function of sensing a contact point in an active area, is used as a means of providing a user input interface.

However, contact with the display device is a cause to generate static electricity. The static electricity generated outside the display device can cause a malfunction or image quality degradation of the display device.

In particular, the LCD adjusts light transmittance of the pixel area by using an electric field that arranges liquid crystal molecules of a liquid crystal layer. However, an inflow of an external static electricity can deform electric fields of some pixel areas, and thereby an arrangement of the liquid crystal molecules can be distorted. As a result, the image quality degradation such as a stain can occur.

In order to minimize the influence of the static electricity, the display device generally includes an antistatic layer disposed on a surface thereof. In addition, it is important to ground the antistatic layer in order to discharge the static electricity collected in the antistatic layer.

In a conventional display device, an antistatic layer is grounded by interconnecting the antistatic layer and a ground pad by means of a conductive tape or a flexible conductive film.

Accordingly, it is difficult to reduce manpower, time, and cost required to ground the antistatic layer. In addition, there is a limitation in reducing a bezel width since it is necessary to secure an area where the conductive tape or flexible conductive film to interconnect the antistatic layer and the ground pad can be disposed.

SUMMARY OF THE INVENTION

Embodiments disclosed herein provide a display device that can simplify a process for grounding an antistatic layer and reduce a bezel width.

Objects of the present disclosure are not limited to the aforementioned objects, and the other objects and advantages of the present disclosure will become apparent from the following description of embodiments. In addition, it is easily understood that the objects and advantages of the present disclosure can be achieved by the means described in the claims and a combination thereof.

According to embodiments of the present disclosure, there is provided a display device including a first substrate including a thin film transistor array and a ground pad disposed on a first surface of the first substrate, a second substrate that faces the first surface of the first substrate and is bonded to the first substrate, a reinforcing substrate that faces a second surface of the first substrate, an antistatic layer disposed between the first substrate and the reinforcing substrate, and a ground path unit formed in a line shape that encloses a side of the first substrate and configured to interconnect the ground pad and the antistatic layer.

The display device can further include a first polarizing film disposed on the second surface of the first substrate and configured to polarize light emitted from the second surface of the first substrate. The first polarizing film can include a polarizing structure disposed on the second surface of the first substrate and the antistatic layer disposed on the polarizing structure.

Here, the polarizing structure can include a first base disposed on the second surface of the first substrate, a second base having one surface that faces the first base; and a stretching layer disposed between the first and second bases. The antistatic layer can be disposed on another surface of the second base.

The antistatic layer can have a sheet resistance of 106.5 to 108.5 $\Omega/cm^{-2}$.

The ground path unit can include an opaque conductive material, and the opaque conductive material can be selected from at least one of polypyrrole, a carbon nanotube (CNT), graphine, Ag and Cu.

The display device according to an embodiment of the present disclosure can include a ground path unit provided through a process of jetting the opaque conductive material so as to ground the antistatic layer.

The process for grounding the antistatic layer is simpler and easier in comparison to a case of using an additional conductive tape or flexible conductive film, thereby reducing the time, cost, and manpower required for the process Also, it is possible to reduce an arrangement space and a marginal space in the process in comparison to the case of using an additional conductive tape or flexible conductive film, thereby reducing a bezel width.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
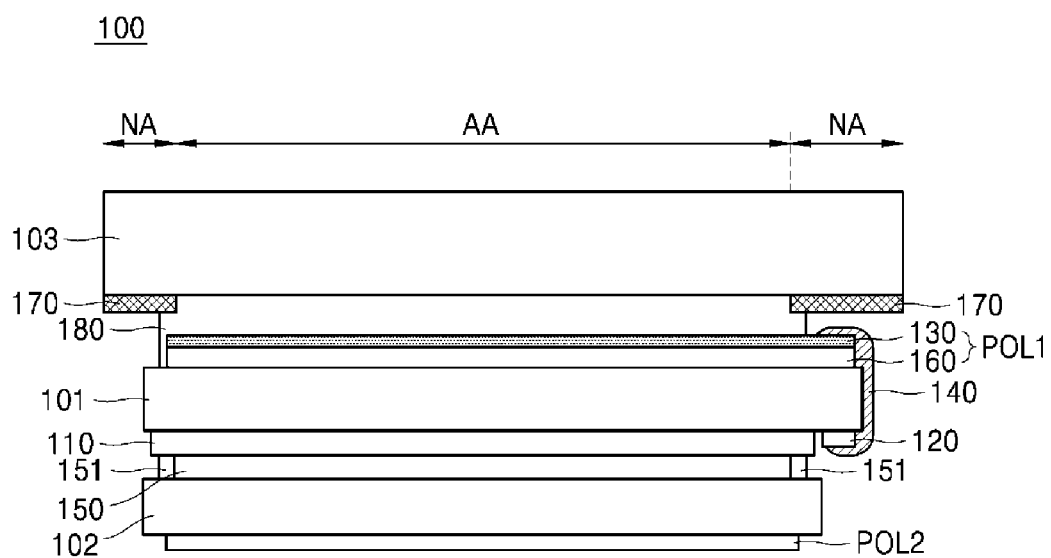
FIG. 1 is a cross-sectional view of a display device according to a first embodiment of the present disclosure.

The above-described objects, features and advantages will be described in detail with reference to the accompanying drawings, so that those skilled in the art can easily carry out a technical idea of the present disclosure. In the description of the embodiments, the detailed description of well-known related configurations or functions will be omitted when it is deemed that such description will cause ambiguous interpretation of the present disclosure. Hereinafter, preferred embodiments of the present disclosure will be described in detail with reference to the accompanying drawings. In the drawings, same reference numerals designate same or like elements.

Hereinafter, a display device according to respective embodiments of the present disclosure will be described in detail with reference to the accompanying drawings.

Firstly, a display device according to a first embodiment will be described with reference to FIGS. 1 to 3. All the components of the display device according to all embodiments of the present disclosure are operatively coupled and configured.

FIG. 1 is a cross-sectional view of a display device according to a first embodiment. FIG. 2 shows an example of the first polarizing film of FIG. 1. FIG. 3 shows arrangements of a reinforcing substrate, a first substrate, an antistatic layer, an active area, and a ground path unit in the display device of FIG. 1.

As shown in FIG. 1, a display device 100 according to the first embodiment can include a first substrate 101, a second substrate 102 that faces one surface of the first substrate 101, a reinforcing substrate 103 that faces the other (or another) surface of the first substrate 101, a thin film transistor array 110 and a ground pad 120 disposed on one surface of the first substrate 101, an antistatic layer 130 disposed between the first substrate 101 and the reinforcing substrate 103, and a ground path unit 140 disposed on a side of the first substrate 101.

In a liquid crystal display device in which light transmittance of the pixel area is adjusted by means of an arrangement of liquid crystals, the display device 100 can further include a liquid crystal layer 150 disposed between the first and second substrates 101 and 102, a sealing layer 151 to bond the first substrate 101 and second substrate 102 to each other, a first polarizing film POL1 to polarize light transmitted through the liquid crystal layer 150, and a second polarizing film POL2 to polarize light incident to the liquid crystal layer 150.

The first polarizing film POL1 can include a polarizing structure 160 disposed on the other surface of the first substrate 101 and an antistatic layer 130 disposed on the polarizing structure 160.

For example, the first substrate 101 and the second substrate 102 can be selected from any one of a rigid material such as glass or the like and a ductile material such as polyimide or the like.

The reinforcing substrate 103 can be made of glass having higher rigidity than the first substrate 101 and the second substrate 102.

The thin film transistor array 110 and the ground pad 120 can be disposed on one surface of the first substrate 101 that faces the second substrate 102.

The thin film transistor array 110 can define a plurality of pixel areas corresponding to an active area AA where light is emitted, and generate an electric field corresponding to the light transmittance of each of the pixel areas. Hereinafter, the thin film transistor array 110 will be described in more detail with reference to FIGS. 4 to 6.

The ground pad 120 can be connected to a ground voltage GND. Here, the ground power GND can be supplied from a predetermined circuit board connected to the first substrate 101.

The antistatic layer 130 can be provided as a part of the first polarizing film POL1.

Figure 2:
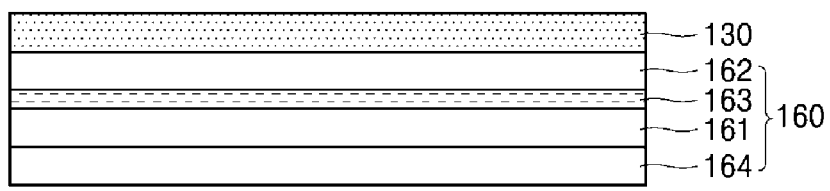
FIG. 2 shows the first polarizing film of FIG. 1.

As shown in FIG. 2, the first polarizing film POL1 can include a polarizing structure 160 and an antistatic layer 130 disposed on the polarizing structure 160.

The polarizing structure 160 can include a first base 161 and a second base 162 that face each other, and a stretching layer 163 disposed between the first base 161 and the second base 162. That is, the first base 161 can be disposed on the other surface of the first substrate 101 that faces the reinforcing substrate 103.

One surface of the second base 162 can face the first base 161.

The stretching layer 163 can be provided through a process of stretching a material such as poly vinyl alcohol (PVA).

In addition, the polarization structure 160 can further include a double-sided tape 164 between the first base 161 and the first substrate 101. By means of the double-sided tape 164, the first polarizing film POL1 can be fixed on the first substrate 101.

The antistatic layer 130 can be disposed on the other surface of the second base 162. For example, the antistatic layer 130 can be provided by performing an antistatic processing operation on the other surface of the second base 162, and thereby it is possible to easily prepare the antistatic layer 130. The antistatic layer 130 can have a sheet resistance of 106.5 to 108.5 $\Omega/cm^{-2}$.

When the antistatic layer 130 having a sheet resistance of 108.5 $\Omega/cm^{-2}$ or less is disposed, static electricity introduced from the outside can be appropriately collected by the antistatic layer 130.

Further, when the antistatic layer 130 having a high sheet resistance of 106.5 $\Omega/cm^{-2}$ or more in comparison to a transparent conductive material such as ITO, is disposed, it is possible to prevent degradation of a touch sensing function resulting from the antistatic layer 130.

In other words, the thin film transistor array 110 can include a touch sensing electrode to implement a capacitive touch sensing function.

Here, contact made on the reinforcing substrate 103 can be sensed by the touch sensing electrode of the thin film transistor array 110. But, when the antistatic layer 130 having a relatively low sheet resistance is disposed on the display surface, a variation in capacitance between the reinforcing substrate 103 and the touch sensing electrode of the thin film transistor array 110 can be reduced.

As described above, the smaller the variation in capacitance corresponding to the contact, the lower the accuracy and sensitivity of the touch sensing function.

However, according to the first embodiment, the antistatic layer 130 is not made of a transparent conductive material, and accordingly the antistatic layer 130 can have a sheet resistance of 106.5 Ωcm2 or more. Thus, it is possible to prevent the accuracy and sensitivity of the touch sensing function being lowered due to the antistatic layer 130.

The first polarizing film POL1 can include the antistatic layer 130, and the antistatic layer 130 can include an area connected to the ground path unit 140 so as to be grounded.

Figure 3:
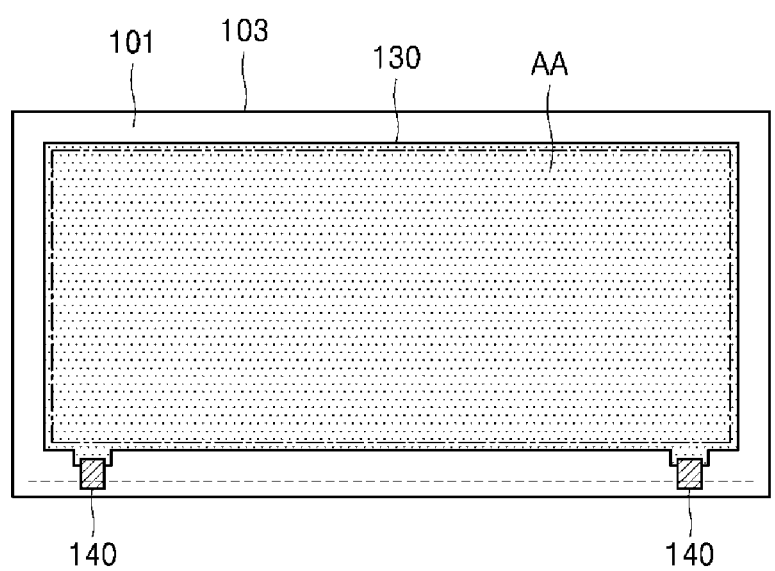
FIG. 3 shows arrangements of a reinforcing substrate, a first substrate, an antistatic layer, an active area, and a ground path unit in the display device of FIG. 1.

Hence, as shown in FIG. 3, the first polarizing film POL1 including the antistatic layer 130 can have a shape that protrudes outward from the active area AA and includes an extended area in contact with the ground path unit 140. Alternatively, the first polarizing film POL1 can have a rectangular shape that extends outward from the active area AA to be in contact with the ground path unit 140.

In addition, the second polarizing film POL2 can have the same structure as the first polarizing film POL1 shown in FIG. 2 except that the second polarizing film POL2 does not include the antistatic layer 130, is disposed on the other surface of the second substrate 102, and has a polarization axis perpendicular to the first polarizing film POL1.

Referring back to FIG. 1, the antistatic layer 130 can be connected to the ground pad 120 by the ground path unit 140. That is, the ground path unit 140 can interconnect the antistatic layer 130 and the ground pad 120, and can be formed in a line shape that encloses the side of the first substrate 101.

The ground path unit 140 can include an opaque conductive material. For example, the ground path unit 140 can be provided in a color that is not a white color with visibility.

For example, the ground path unit 140 can be provided through a process of jetting a liquid material including an opaque conductive material. Here, in order to prepare the ground path unit 140, a curing process can be performed after the jetting process.

In addition, the opaque conductive material of the ground path unit 140 can be selected from at least one of polypyrrole, a carbon nano tube (CNT), graphine, Ag, and Cu.

The visibility of the ground path unit 140 can be lowered even when the ground path unit 140 is not covered with the light blocking layer 170 disposed on the reinforcing substrate 103 because the ground path unit 140 is made of a non-white opaque material.

For example, when the ground path unit 140 is covered with the light blocking layer 170, the ground path unit 140 can be made of Ag.

Alternatively, the ground path unit 140 can be made of Ag and Cu plated on a surface of Ag, irrespective of whether or not the ground path unit 140 overlaps the light blocking layer 170.

Alternatively, the ground path unit 140 can be made of a mixture of CNT and Ag, irrespective of whether or not the ground path unit 140 overlaps the light blocking layer 170.

Alternatively, the ground path unit 140 can be made of a mixture of polypyrrole and Ag, and Cu plated on a surface of the mixture, irrespective of whether or not the ground path unit 140 overlaps the light blocking layer 170.

Alternatively, the ground path unit 140 can be made of polypyrrole.

Here, the opaque conductive material of the ground path unit 140 can be selected in consideration of resistance, thermal stability, atmospheric stability, ease of application to the jetting process and opacity of the ground path unit 140.

For example, when the ground path portion 140 with a relatively low resistance is required, the ground path unit 140 can be made of a material including Ag. Alternatively, when the ground path unit 140 with a relatively high oxidation stability and ease of process is required, the ground path unit 140 can be made of a material including polypyrrole.

But, the foregoing is merely an example, and the ground path unit 140 can be made of any material as long as it has high electrical conductivity and opacity and is suitable for the jetting process.

As shown in FIG. 3, the ground pad (120 of FIG. 1) and the ground path unit 140 can be disposed in a non-active area (NA of FIG. 1) formed outside of the active area AA.

For example, an area where the ground pad (120 of FIG. 1) and the ground path unit 140 are disposed can be adjacent to a pad unit of the first substrate 101 to which an external circuit board is connected, and correspond to one edge (a lower edge of FIG. 3) of the active area AA.

But, the foregoing is merely an example, and at least one ground pad (120 of FIG. 1) and ground path portion 140 can be disposed in any area as long as they are disposed in the non-active area (NA of FIG. 1). For example, in order to improve the reliability of electrostatic discharge, at least one ground path unit 140 can be disposed in each area corresponding to each edge of the active area AA among non-display area (NA of FIG. 1).

As shown in FIG. 1, the display device 100 can further include a light blocking layer 170 disposed on one surface of the reinforcing substrate 103 and corresponding to the non-active area NA, and an adhesive layer 180 disposed between the antistatic layer 130 and the reinforcing substrate 103. Here, the light blocking layer 170 can face the first substrate 101.

The light blocking layer 170 can be disposed on one surface of the reinforcing substrate 103 that faces the first substrate 101 and correspond to the non-active area NA. The light blocking layer 170 can block light leakage generated in the non-active area NA of the reinforcing substrate 103.

In addition, it is possible to prevent the ground path unit 140 from being visible as the light blocking layer 170 overlaps the ground path unit 140 disposed in the non-active area NA.

The adhesive layer 180 can be disposed between the first polarizing film POL1 and one surface of the reinforcing substrate 103. By means of the adhesive layer 180, the reinforcing substrate 103 can be fixed on the other surface of the first substrate 101. For example, the adhesive layer 180 can be made of a UV curable transparent adhesive material such as an optical clear resin (OCR).

The thin film transistor array 120 disposed on one surface of the first substrate 101 will be described with reference to FIGS. 4 to 6.

Figure 4:
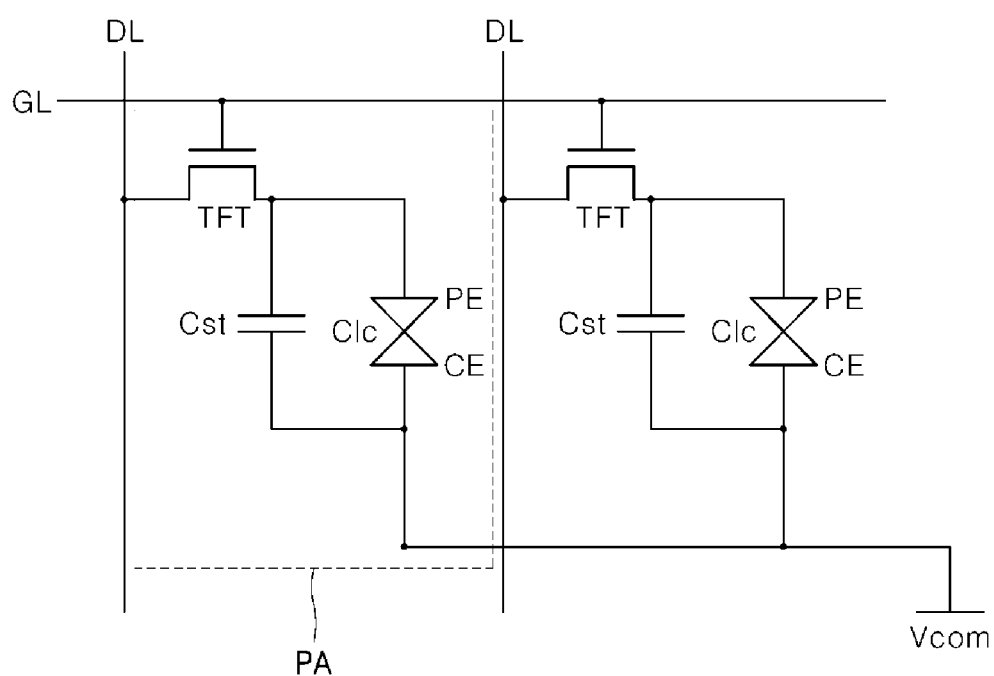
FIG. 4 shows an equivalent circuit of a pixel area in the display device of FIG. 1.

FIG. 4 shows an equivalent circuit of a pixel area in the display device of FIG. 1. FIG. 5 is a cross-sectional view of a thin film transistor array according to an embodiment. FIG. 6 shows a touch sensing electrode in the thin film transistor array of FIG. 5.

As shown in FIG. 4, the thin film transistor array 120 can include a gate line GL and a data line DL that cross each other, a thin film transistor that corresponds to a pixel area PA defined by crossing the gate line GL and the data line DL, a storage capacitor Cst and a pixel electrode PE.

Liquid crystals of the pixel area PA having a predetermined liquid crystal capacitance Clc can be rearranged by an electric field formed between the pixel electrode PE and a common electrode CE.

Specifically, when the thin film transistor TFT is turned on based on a gate signal of the gate line GL in the pixel area PA, a data signal of the data line DL can be supplied to the pixel electrode PE through the turned on thin film transistor TFT. A common signal corresponding to a common voltage Vcom can be supplied to the common electrode CE.

As the data signal is supplied to the storage capacitor Cst and the pixel electrode PE, a predetermined electric field can be formed between the pixel electrode PE and the common electrode CE.

For example, the liquid crystal capacitance Clc and the storage capacitor Cst can be charged. Here, the liquid crystal capacitance Clc can correspond to the pixel electrode PE and the common electrode CE. Also, liquid crystal materials of the liquid crystal layer (150 of FIG. 1) corresponding to the pixel area PA can be tilted by the electric field between the pixel electrode PE and the common electrode CE, and accordingly the light transmittance of the pixel area can be adjusted.

Figure 5:
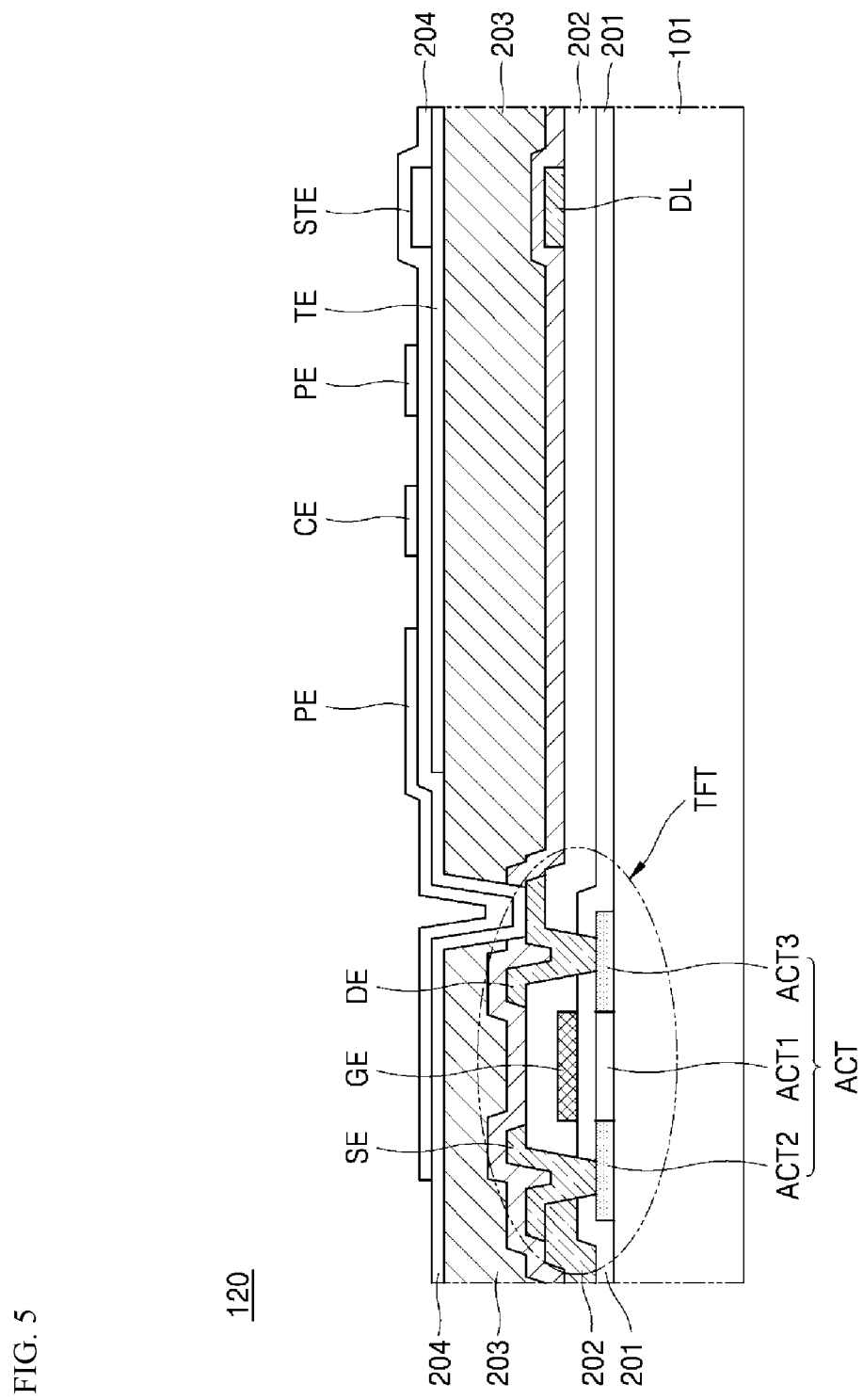
FIG. 5 is a cross-sectional view of a thin film transistor array according to an embodiment of the present disclosure.

As shown in FIG. 5, the thin film transistor TFT of the pixel area PA can be disposed on one surface of the first substrate 101, and can include an active layer ACT, a gate electrode GE, a source electrode SE and a drain electrode DE. Here, any one of the source electrode SE and the drain electrode DE can be connected to the data line DL, and the other one can be connected to the pixel electrode PE.

For example, the active layer ACT can be disposed on the first substrate 101, and can include a channel area ACT1, and a source area ACT2 and a drain area ACT3 respectively formed on opposite sides of the channel area ACT1

The gate electrode GE can be disposed on a gate insulating film 201 that covers the active layer ACT. The gate line GL connected to the gate electrode GE can be disposed on the gate insulating film 201 together with the gate electrode GE.

The source electrode SE and the drain electrode DE can be disposed on a source-drain insulating film 202 that covers the gate electrode GE. The source electrode SE can be connected to the source area ACT2, and the drain electrode DE can be connected to the drain area ACT3.

Any one (e.g., the source electrode SE of FIG. 5) of the source electrode SE and the drain electrode DE can be connected to the data line DL, and the other one (the drain electrode DE of FIG. 5) can be connected to the pixel electrode PE. In addition, the data line DL connected to any one of the source electrode SE and the drain electrode DE can be disposed on the source-drain insulating film 202 together with the source electrode SE and the drain electrode DE.

The gate line GL, the data line DL, and the thin film transistor TFT can be covered with a first interlayer insulating film 203.

The touch sensing electrode PE can be disposed on the first interlayer insulating film 203.

Figure 6:
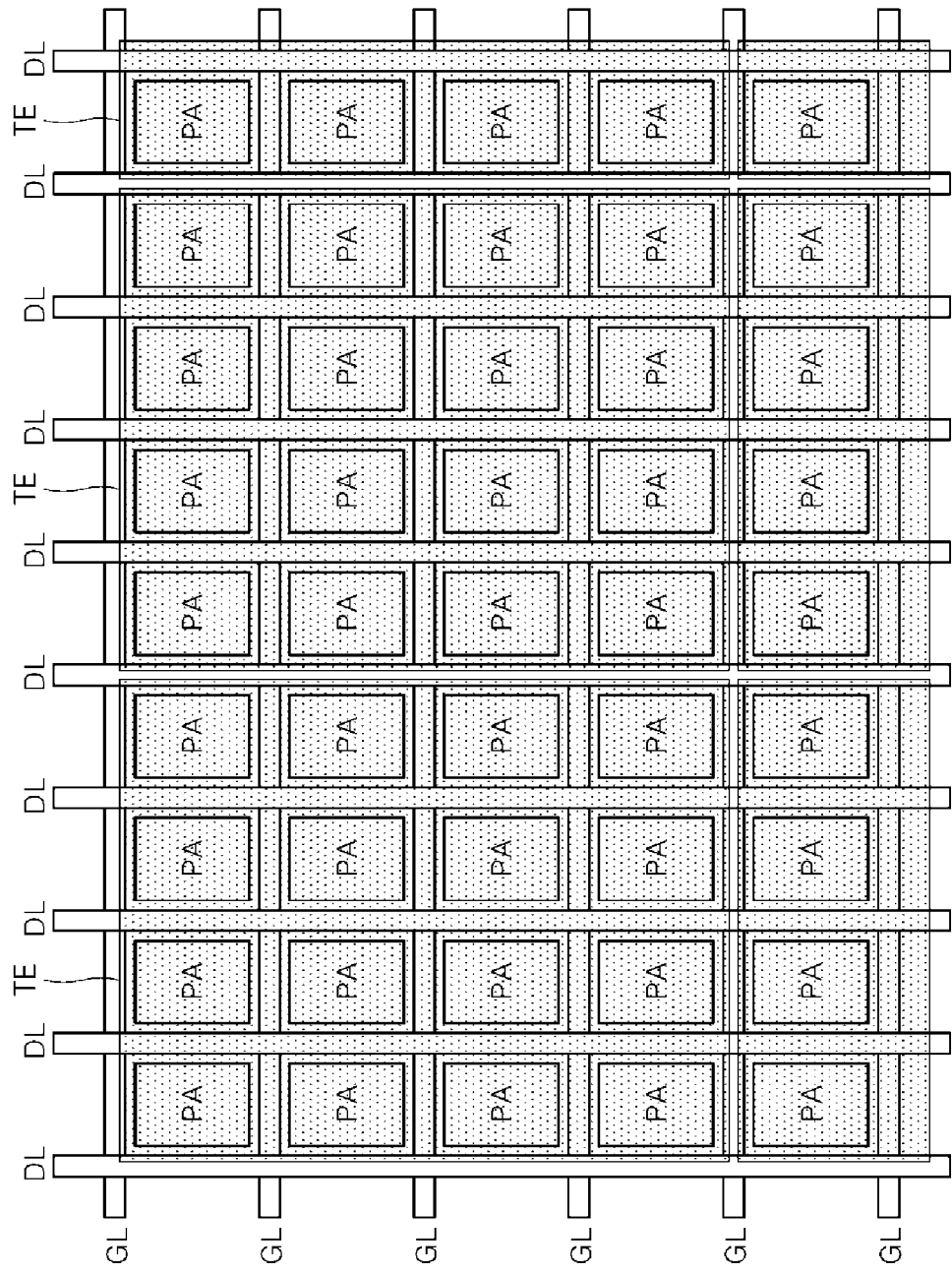
FIG. 6 shows a touch sensing electrode in the thin film transistor array of FIG. 5.

As shown in FIG. 6, the touch sensing electrode PE can correspond to two or more consecutive pixel areas PA.

In addition, as shown in FIG. 5, the thin film transistor array 120 can further include an auxiliary electrode STE disposed on the touch sensing electrode PE so as to lower the resistance of the touch sensing electrode PE. Here, the auxiliary electrode STE can overlap at least one of the data line DL and the gate line GL.

The pixel electrode PE and the common electrode CE can be disposed on a second interlayer insulating film 204 that covers the touch sensing electrode PE.

The pixel electrode PE can be connected to the other one (the drain electrode DE of FIG. 5) of the source electrode SE and the drain electrode DE which is not connected to the data line DL through a contact hole that passes through the first and second interlayer insulating films 203 and 204.

The pixel electrode PE and the common electrode CE can be alternately disposed in a comb shape in the pixel area PA.

The display device 100 can further include a color filter to display a color image, and the color filter can be disposed on any one of the first substrate 101 and the second substrate 102.

For example, the color filter can be provided on one surface of the first substrate 101 as a part of the thin film transistor array 110. Alternatively, the color filter can be disposed on one surface of the second substrate 102.

As described above, in the display device 100 according to the first embodiment, the thin film transistor array 110 can be disposed on one surface of the first substrate 101 among the first and second substrates 101 and 102 that face each other and are bonded to each other with the liquid crystal layer 150 positioned therebetween, and the other surface of the first substrate 101 can serve as a light emitting surface.

Accordingly, the thin film transistor array 110 can be closer to the reinforcing substrate 103 where a touch input occurs in comparison to a case where the second substrate 102 includes the light emitting surface, thereby improving the accuracy of the touch sensing function of the touch sensing electrode PE included in the thin film transistor array 110.

The antistatic layer 130 to discharge static electricity can be provided as an element of the first polarizing film POL1 disposed on the other surface of the first substrate 101. Accordingly, an additional process for attaching the antistatic layer 130 is unnecessary, thereby making the manufacturing process simpler and easier.

The antistatic layer 130 can be provided by performing an antistatic processing operation on the second base 162 of the polarizing structure 160 of the first polarizing film POL1, and accordingly can have a high sheet resistance of 106.5 Ω/cm2 or more in comparison to a case where the antistatic layer 130 is made of a transparent conductive material. Thus, it is possible to prevent the accuracy and reliability of the touch sensing function from being lowered due to the antistatic layer 130.

Also, the ground path unit 140 to ground the antistatic layer 130 can be formed in a line shape that encloses a side of the first substrate 101 through the jetting process.

For example, since the conventional display device uses an additional conductive tape or flexible conductive film so as to ground the antistatic layer, it is necessary to perform processes for preparing, aligning, connecting and fixing the conductive tape or flexible conductive film.

On the other hand, according to the first embodiment, the antistatic layer 130 can be grounded by means of the ground path unit 140 provided through the jetting process, thereby achieving grounding of the antistatic layer 130 through a simpler and easier process.

Also, the ground path unit 140 can be formed to be sprayed on the side of the first substrate 101, and accordingly an arrangement space and a marginal space in the process can be smaller in comparison to a case of using the conductive tape or flexible conductive film, thereby reducing the bezel width of the display device 100.

The display device 100 according to the first embodiment can include the antistatic layer 130 provided as an element of the first polarizing film POL1.

But, the antistatic layer 130 can be replaced with any element as long as it is disposed between the first substrate 101 and the reinforcing substrate 103.

Figure 7:
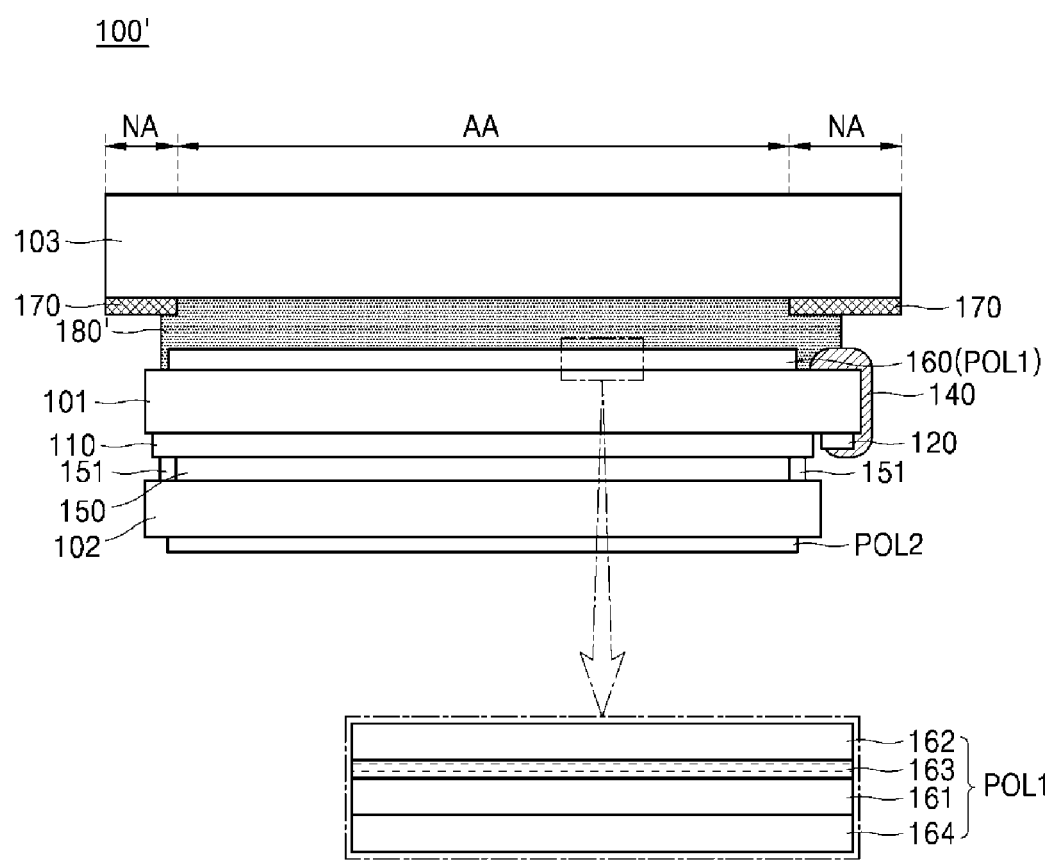
FIG. 7 is a cross-sectional view of a display device according to a second embodiment of the present disclosure.

FIG. 7 is a cross-sectional view of a display device according to a second embodiment.

As shown in FIG. 7, a display device 100' according to the second embodiment is the same as (or similar to) the display device 100 according to the first embodiment, except that the antistatic layer (130 of FIG. 1) is replaced with the adhesive layer 180' to fix the reinforcing substrate 103, the adhesive layer 180' extends to the non-active area NA to be in contact with the ground path unit 140, and the first polarizing film POL1 corresponds to the active area AA. Therefore, the description related to the same configuration will be omitted hereinafter.

The adhesive layer 180' can be disposed between the first polarizer film POL1 disposed on the first substrate 101 and the reinforcing substrate 103, and the reinforcing substrate can be fixed on the other surface of the first substrate 101.

The adhesive layer 180' can be made of an adhesive material having conductivity so as to provide a function of collecting static electricity in place of the antistatic layer (130 of FIG. 1).

The adhesive layer 180' having conductivity can be connected to the ground pad 120 through the ground path unit 140.

As described above, according to the second embodiment, it is unnecessary to deform the first polarizing film POL1 unlike the first embodiment, and thereby it is possible to utilize the first polarizing film POL1 as it is.

The display device 100 can further include an antistatic auxiliary layer disposed between the second substrate 102 and the second polarizing film POL2 so as to discharge static electricity introduced from an opposite side of the display surface. In this case, the antistatic layer can be also grounded through the ground path unit 140.

Figure 8:
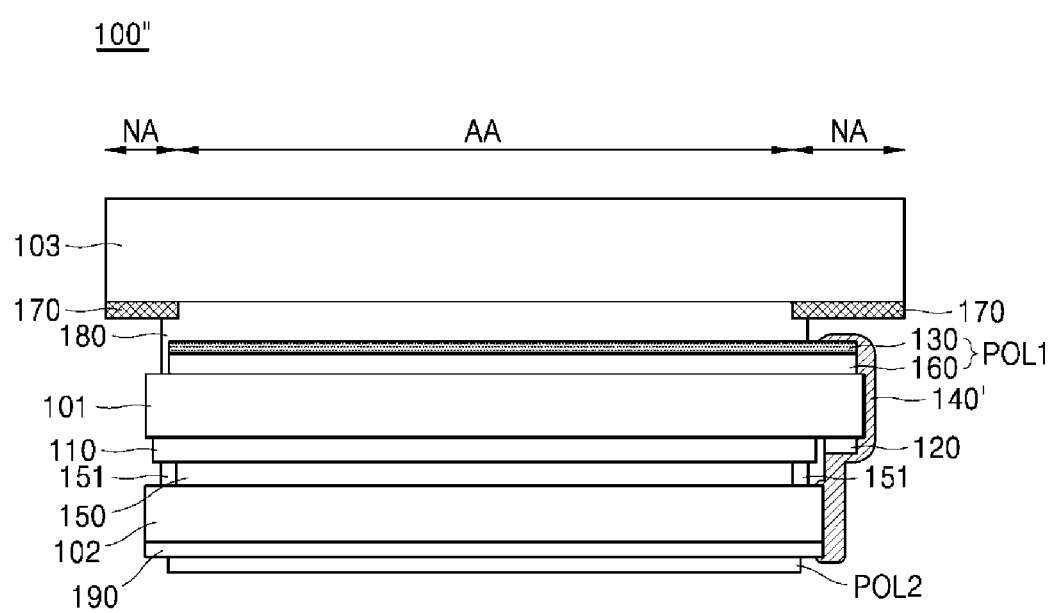
FIG. 8 is a cross-sectional view of a display device according to a third embodiment of the present disclosure.

FIG. 8 is a cross-section view of a display device according to a third embodiment.

As shown in FIG. 8, a display device 100" according to the third embodiment is the same as (or similar to) the display device 100 according to the first embodiment, except that the display device 100" further includes an antistatic auxiliary layer 190, and a ground path unit 140' is connected to the antistatic auxiliary layer 190. Therefore, the description related to the same configuration will be omitted hereinafter.

The antistatic auxiliary layer 190 can be disposed on the other surface of the second substrate 102 that does not face the first substrate 101. The antistatic auxiliary layer 190 can be made of a conductive material such as a conductive polymer, ITO, and metal. For example, the antistatic auxiliary layer 190 can be made of ITO having a relatively low sheet resistance in consideration of the efficiency of collecting static electricity.

The ground path unit 140' can extend to a side of the second substrate 102 and interconnect the ground pad 120 and the antistatic auxiliary layer 190.

As described, according to the third embodiment, it is easy and simple to perform the process for grounding of the antistatic auxiliary layer 190, and it is possible to prevent an increase in the bezel width.

The present disclosure is described with reference to embodiments described herein and accompanying drawings, but is not limited thereto. It should be apparent to those skilled in the art that various changes or modifications which are not exemplified herein but are still within the spirit and scope of the present disclosure can be made.

What is claimed is:

1. A display device having a structure capable of emitting external static electricity, the display device comprising:
a first substrate including a thin film transistor array and a ground pad disposed on a first surface of the first substrate;
a second substrate that faces the first surface of the first substrate, and is bonded to the first substrate;
a reinforcing substrate that faces a second surface of the first substrate;
an antistatic layer disposed between the first substrate and the reinforcing substrate and configured to discharge the static electricity;
an antistatic auxiliary layer disposed on a first surface of the second substrate; and
a ground path unit formed in a line shape that encloses a side of the first substrate and covers a side of the second substrate, the ground path unit being configured to interconnect the ground pad and the antistatic layer,
wherein the ground path unit contacts an outer edge of the antistatic layer, an outer edge of the first substrate, an outer edge of the ground pad, an outer edge of the second substrate and an outer edge of the antistatic auxiliary layer.

2. The display device of claim 1, further comprising:
a first polarizing film disposed on the second surface of the first substrate and configured to polarize light emitted from the second surface of the first substrate.

3. The display device of claim 2, wherein:
the first polarizing film comprises a polarizing structure disposed on the second surface of the first substrate and the antistatic layer disposed on the polarizing structure,
the polarizing structure comprises:
a first base disposed on the second surface of the first substrate;
a second base having one surface that faces the first base; and
a stretching layer disposed between the first and second bases, and
the antistatic layer is disposed on another surface of the second base.

4. The display device of claim 2, wherein:
the antistatic layer is disposed between the first polarizing film and the reinforcing substrate, configured to fix the reinforcing substrate on the second surface of the first substrate, and made of an adhesive material having conductivity.

5. The display device of claim 2, wherein the ground path unit overlaps with and contacts two different surfaces of the first polarizing film.

6. The display device of claim 1, wherein:
the antistatic layer has a sheet resistance of approximately $10^{6.5}$ to $10^{8.5}$ $\Omega/cm^2$.

7. The display device of claim 1, wherein:
the ground path unit includes an opaque conductive material.

8. The display device of claim 7, wherein:
the opaque conductive material is selected from at least one of polypyrrole, a carbon nanotube (CNT), graphine, Ag and Cu.

9. The display device of claim 1, further comprising:
a second polarizing film disposed on the antistatic auxiliary layer,
wherein a second surface of the second substrate faces the first substrate.

10. The display device of claim 9, wherein:
the ground path unit extends to a side of the second substrate and further interconnects the ground path unit and the antistatic auxiliary layer.

11. The display device of claim 9, wherein the ground path unit overlaps with and contacts two different surfaces of the second polarizing film.

12. The display device of claim 9, wherein the first and second substrates are disposed between the first and second polarizing films.

13. The display device of claim 1, further comprising:
a light blocking layer disposed on one surface of the reinforcing substrate,
wherein one surface of the reinforcing substrate faces the second surface of the first substrate and includes an active area where light is emitted and a non-active area formed outside of the active area,
the light blocking layer corresponds to the non-active area, and
the ground path unit overlaps the light blocking layer.

14. The display device of claim 1, further comprising:
a liquid crystal layer disposed between the first and second substrates.

15. The display device of claim 1, wherein the ground path unit includes a stepped portion overlapping with the ground pad.

16. The display device of claim 1, wherein the ground path unit overlaps with and contacts three different surfaces of the first substrate.

17. The display device of claim 1, wherein the ground path unit overlaps with and contacts two different surfaces of the second substrate.

18. The display device of claim 1, wherein the ground path unit overlaps with and contacts two different surfaces of the ground pad.

* * * * *